United States Patent [19]

Goetze et al.

[11] 4,445,202

[45] Apr. 24, 1984

[54] ELECTRICALLY SWITCHABLE PERMANENT STORAGE

[75] Inventors: Volkmar Goetze, Grafenau; Ekkehard F. Miersch, Boeblingen; Guenther Potz, Sindelfingen, all of Fed. Rep. of Germany

[73] Assignee: International Business Machines Corporation, Armonk, N.Y.

[21] Appl. No.: 317,669

[22] Filed: Nov. 2, 1981

[30] Foreign Application Priority Data

Nov. 12, 1980 [EP] European Pat. Off. ...... 80 10 6964.2

[51] Int. Cl.³ ............................................ G11C 13/00
[52] U.S. Cl. .................................. 365/182; 365/189; 357/23
[58] Field of Search ............... 365/174, 182, 189, 230, 365/218; 357/23 VT

[56] References Cited

U.S. PATENT DOCUMENTS

| | | | |
|---|---|---|---|
| 3,987,286 | 10/1976 | Muehldorf | 235/152 |
| 4,041,459 | 8/1977 | Horninger | 340/166 R |
| 4,184,085 | 1/1980 | Takahashi | 365/182 |
| 4,247,918 | 1/1981 | Iwahashi et al. | 365/218 |

FOREIGN PATENT DOCUMENTS 2844955 4/1979 Fed. Rep. of Germany .
2937337 3/1981 Fed. Rep. of Germany .

OTHER PUBLICATIONS

MOS/LSI Design and Application, W. Carr & J. Mize, McGraw Hill 1972, pp. 229-258.
IBM Technical Disclosure Bulletin, vol. 17, No. 3, Aug. 1974, pp. 811-812.
IBM Technical Disclosure Bulletin, vol. 20, No. 10, Mar. 1978, pp. 4016-4018.

Primary Examiner—Terrell W. Fears
Attorney, Agent, or Firm—T. Rao Coca

[57] ABSTRACT

For read-only storages and in particular for PLA applications, improved coupling elements together with an associated personalization scheme permit the storing of at least two memory (or logic) connection patterns selectable independently of each other. Quick electrical switching between at least two functional modes in the same storage array, is also provided. One device field effect transistor (FET) cells with specific gate configurations depending on the respective personalization state are used as coupling elements. For instance, in a two-fold personalization permanent storage, the coupling elements consist of FETs with two gate sections provided one beside the other. For a connection to be established in only one of the two possible functions at the respective crosspoint, one of the gate sections is connected to the control line provided for the functional selection. The remaining gate section is connected to the associated input line. A connection in the other functional mode is provided correspondingly with only the control lines being switched. If at the respective crosspoint a connection is to be effective in both functional modes, both gate sections are jointly connected to the respective input line. By using only one common peripheral circuit, PLAs with multiple personalization properties can be made in integrated technology, with the same semiconductor area requirement as PLAs personalizable into only one functional mode.

8 Claims, 6 Drawing Figures

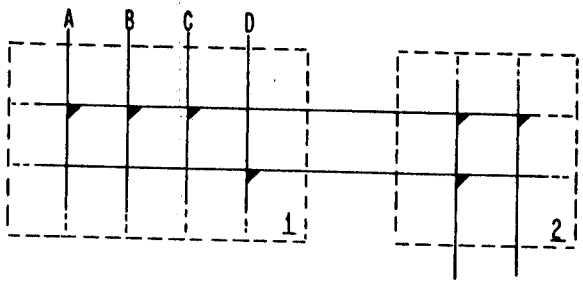
FIG. 1  $F1: X = \bar{A}\cdot\bar{B}\cdot\bar{C}+\bar{D}$
$Y = \bar{A}\cdot B\cdot\bar{C}$
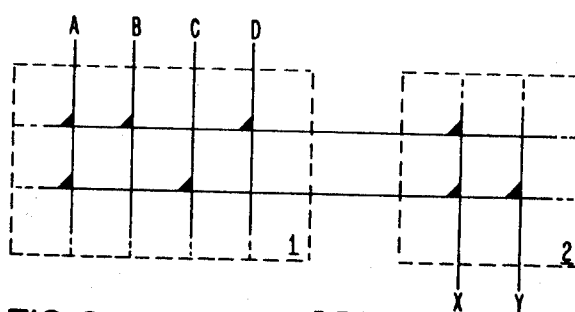
FIG. 2  $F2: X = \bar{A}\cdot\bar{B}\cdot\bar{D}+\bar{A}\cdot\bar{C}$
$Y = \bar{A}\cdot\bar{C}$
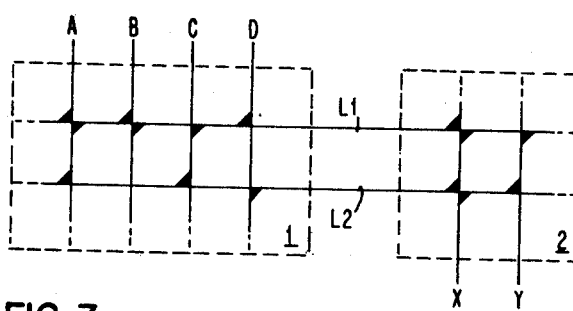
FIG. 3
$F1 \rightarrow \dashv\ \begin{matrix}c=1\\ \bar{c}=0\end{matrix}$
$F2 \rightarrow \dashv\ \begin{matrix}c=0\\ \bar{c}=1\end{matrix}$

ELECTRICALLY SWITCHABLE PERMANENT STORAGE

BACKGROUND OF THE INVENTION

The invention relates to electrically switchable storage arrays. More particularly, the invention relates to switchable permanent or read-only storage arrays with coupling elements provided at the crosspoints of a matrix arrangement. The coupling elements are functionally personalized to selectively provide electrically conductive connections. Permanent storage arrays such as read only memories (ROMs) and programmable logic arrays (PLAs) are used in the computer field for storing fixed data permanently, i.e. nondestructively. PLAs have been discussed as increasingly interesting embodiments of permanent storage matrices, which are described in general in the book "MOS/LSI Design and Application" by W. Carr and J. Mize, McGraw Hill 1972, pages 229 to 258.

Such PLAs composed of ROMs (AND/OR arrays) permit the direct implementation of (minimized) combinatorial logic in the matrix arrangements of regular array structures. Compared with the irregular structure of logic systems, such permanent storage arrays are advantageously used as unilateral correlators, making them increasingly attractive as replacements for combinatorial logic, as storages for tables, constants and programs, as hard wired multipliers, and for code generation/conversion, etc.

In ROMs as well as PLAs constructed with ROMs, personalization of the respective function(s) is generally accomplished during manufacture and is then fixed once and for all. In order to eliminate the resultant inflexibility various alternatives have been suggested. One alternative is a re-programmable read-only storage, as described in U.S. Pat. No. 4,041,459. Although re-programmable, it has a number of disadvantages: as coupling elements or storage cells, respectively $MI_1I_2S$-FETs, i.e. FETs with double layer gate dielectric are required which compared with MOS field effect transistors (FET) are much more complex from a technological point of view. Furthermore, reprogramming requires relatively high voltage pulses in the order of 30 V. Such reprogrammable read-only storages are far too slow for many uses with respect to changeability.

Programmable read-only memories having faster electrical switching speed are also known. For example, U.S. Pat. No. 3,987,286 describes an arrangement where, through time-controlled release or inhibition of logic circuits of the matrix arrangements, different logic functions can be executed in one and the same PLA. A disadvantage of this arrangement is that personalization data must be stored in additionally required shift register elements. Another known type of multiple personalization with specific coupling or logic elements which e.g. can be set to four possible states, is described in IBM TDB Vol. 17, No. 3, August 1974, pages 811/812. Due to the specific components required, and the relative slowness involved, these solutions still need improvement.

Another known type of such read-only memories and particularly PLAs share unused logic areas for further functions, as described in IBM TDB Vol. 20, No. 10, March 1978, pages 4016 to 4018, or provide a multiple use of such areas, as described in U.S. Pat. No. 4,084,152. However, considerable restrictions remain with respect to the degree of freedom left for the designer of complex logic networks. Most of the high degree of flexibility and easy adaptability usually desired from such regular array structures is lost.

Finally, in connection with the structure of electrically alterable permanent storage arrays, memories having MNOS transistor cells or a transistor with "floating" gate in series with one respective associated separating transistor of the conventional MOS type have been described, as for example in GE-OS 28 44 955 and GE-OS 29 37 337. Similarly, as in the above described storage arrays with electrical re-programming means, to which group these storage arrays also belong, there is no quick switching between several functions.

Accordingly, it is an object of the invention to provide an improved permanent storage array as they can be used for PLAs, to the effect of achieving higher functional densities. It is another object of this invention to provide quick electrical switching between different functions in a permanent storage, without a requirement for high voltages or special components for re-programming.

SUMMARY OF THE INVENTION

In accordance with the invention, read-only storage arrays and in particular PLA matrices are provided which permit the storing of at least two storage or logic patterns selectable independently of each other, in one and the same storage array, as well as quick electrical switching between the at least two functional modes. One device FET cells with specific gate configurations depending on the respective personalization states are used as coupling elements. For a two-fold personalization permanent storage, the coupling elements consist of FETs with two adjacent gate sections. If a connection is to be established in only one of two possible functions at a particular crosspoint, then only one of the gate sections is connected to a control line for this functional selection. The remaining gate section is connected to the associated input line. A connection in the other functional mode is provided correspondingly with only the control lines being switched. If a connection is to be effective in both functional modes at the particular crosspoint, then both gate sections are jointly connected to the respective input line. A particular advantage of the invention provides highly intergrated and quick-switching permanent storages or PLA functions, with only one common peripheral circuit. In this manner, high density electronic data processor chips with integrated PLA functions can be structured in a system-wise double or multiply architecture.

BRIEF DESCRIPTION OF THE DRAWINGS

The foregoing and other objects, features and advantages of the invention will be described with reference to the drawings which illustrate a preferred embodiment. In the drawings:

FIG. 1 is a schematic personalization instruction for a first PLA function;

FIG. 2 is a schematic personalization instruction for a second PLA function;

FIG. 3 is a schematic personalization instruction for the combination of both above mentioned PLA functions into one PLA;

DETAILED DESCRIPTION OF THE INVENTION

Figure 4:
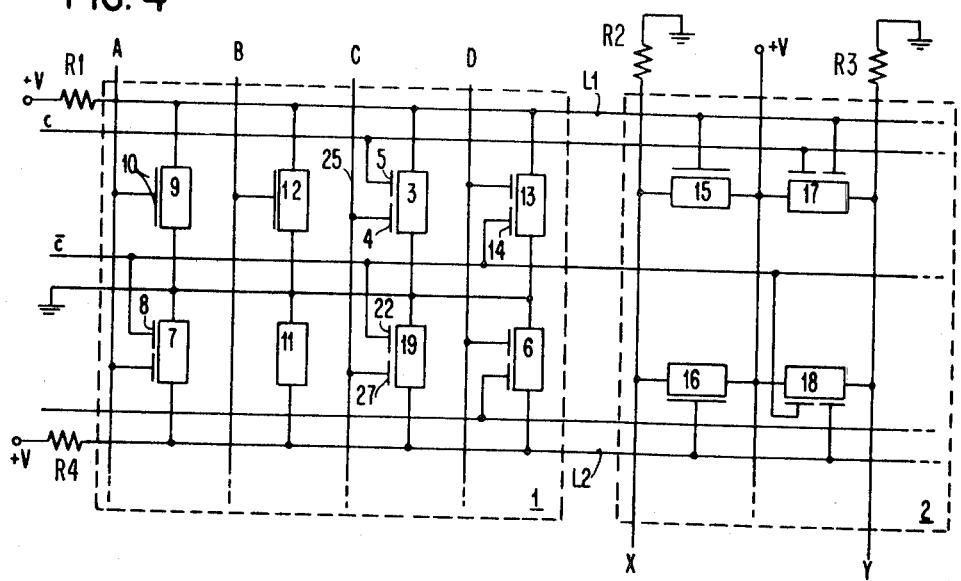
FIG. 4 is a partly schematic electrical circuit diagram for executing both PLA functions in accordance with the invention.

A PLA capable of two-fold functional personalization has been selected for best explaining the invention. The PLA offers two functional states F1 and F2 with different logic functions X and Y of inputs A, B, C and D between which a quick electrical switching is provided. In the different PLA functional states, the logic functions are to be as follows, to give an example:

$$F1: X = \overline{A} \cdot \overline{B} \cdot \overline{C} + \overline{D}$$
$$Y = \overline{A} \cdot \overline{B} \cdot \overline{C}$$

$$F2: X = \overline{A} \cdot \overline{B} \cdot \overline{D} + \overline{A} \cdot \overline{C}$$
$$Y = \overline{A} \cdot \overline{C}$$

FIGS. 1 and 2 illustrate in conventional schematic representation the respective associated personalization of two PLAs of one-fold personalization. Markings at the respective matrix crosspoints indicate whether one of inputs A, B, C, D is to be included in the logic function.

FIG. 3 in accordance with the objects of the present invention, depicts the combined representation of both personalizations in one single PLA with switching between the functional modes F1 and F2. Which of the two functional modes F1, F2 is selected depends on the potential state (logic "0" of "1") of a correspondingly provided pair of control lines c and $\overline{c}$. Reference will be made thereto below in connection with the description of the illustrative embodiment.

For the functional states F1 and F2, the present example is based on the following states of control lines c and $\overline{c}$ (FIG. 3):

F1: c=1 and $\overline{c}$=0

F2: c=0 and $\overline{c}$=1

In FIGS. 1 to 3, reference numbers 1 and 2 represent AND array 1 and OR array 2 each consisting of a ROM matrix connected as PLAs.

The personalization pattern schematically shown in FIG. 3 thus combines the functions illustrated in FIGS. 1 and 2. It can be considered a superimposing of the individual personalization patterns for F1 (FIG. 1) and F2 (FIG. 2).

In accordance with the invention, such a PLA can be designed on a very small amount of semiconductor surface. The novel, highly integratable coupling elements with their possible personalizations permit the realization of PLAs with at least two permanently personalized logic functions selectable independantly of each other, using one and the same peripheral circuitry, practically with an amount of space identical with that which had hitherto been required for one function only. Thus, in a system context there is provided quite a number of new possible uses for such permanent storages.

FIG. 3 shows that in connection with a two-fold personalizable PLA the coupling elements and their "wiring" are to permit at least four different personalizations, i.e. the coupling element between the input line for A and the product term or row line marked L1, i.e. at crosspoint A/L1, is to provide a connection for the selected embodiment in AND array 1, in both functional modes. The coupling element at C/L1, on the other hand, provides a corresponding connection only in functional mode F1, and the coupling element at A/L2 only in functional mode F2. At crosspoint B/L2 no connection is provided in any case; input B is thus ignored with respect to the so-called product term generation on line L2. Such a possible personalization mode is generally called a "Don't care" position in a PLA.

FIG. 4 shows an embodiment of the invention realizing the PLA functions marked in FIG. 3. A characteristic feature of the invention is the type of the coupling elements or cells, and the personalization modes possible with these coupling elements, to which reference has been made above. The coupling elements are designed as FETs for which (at least) two gate sections are provided one beside the other. For enabling the associated switching path of such a coupling element, the respective input switching potentials are required at the (at least) two gate sections. The (at least) two switchable logic functions F1 and F2 are personalized structurally in such a manner that for a connection to be established in one of the two functions only one of the gate sections is connected to the control line determinative for this particular function, and the remaining gate section of such a coupling element is connected to the respective input line. If in both functions a connection is to be provided at the respective crosspoint both gate sections and thus the complete gate are jointly connected to the respective input line. A "Don't care" position is realized in that the respective coupling element is not designed, or designed incompletely so that no connection can be effective at this crosspoint at any time.

Detailed reference will be made below to the PLA of two-fold personalization shown in FIG. 4 as an embodiment. Compared with FIG. 3, the AND array marked 1 with inputs A, B, C, and D is shown again, as well as the OR array marked 2 with outputs X and Y. The connection between arrays 1 and 2 is established by means of (product term) lines L1, L2 as well as by control lines c, $\overline{c}$ for determining the respective functional mode F1 or F2. For the FETs provided as coupling elements N-channel MOSFETs of the enhancement type are assumed for the embodiment. Their basic operation characteristics can be considered known. For better illustration, FIG. 4 is restricted to the peripheral circuit parts necessary for understanding the logic operations, as e.g. the operating voltage supply via +V, and the resistors marked R1, R2, R3, and R4. The figure does not show the various controls or general peripheral circuits, as input buffer, decoder, phase splitter, driver, etc. because the invention does not refer thereto and because the peripheral circuitry can be made conventionally. Reference is made to the above mentioned literature on prior art of these items.

Finally, agreement on a "positive logic" is assumed in connection with this embodiment of the various input-/output and control signals. Consequently, there corresponds to the logic mode "1" the up-level of a binary signal, in the present case e.g. potential +V. Accordingly, the logic mode "0" is represented by the down-voltage level, in the present case ground potential.

An analysis of FIGS. 3 and 4 reveals the steps of the invention for realizing the PLA functionally characterized in FIG. 3, in an actual circuit arrangement. The coupling at crosspoint C/L1 in AND array 1, which e.g. is to be provided in functional mode F1 exclusively, is formed by FET 3 with the two gate sections 4 and 5. Gate section 4 is connected to input C, and gate section 5 to control line c. FET 3 is thus only conductive if both the associated input C and control line c are in the logic "1" mode. Following the above mentioned agreement, however, this is only so in functional mode F1. The same situation applies e.g. also to crosspoint D/L2; the associated coupling element in FIG. 4 is FET 6.

Next, the case will be discussed where there is to be a connection in the functional mode F2 only. This applies e.g. to crosspoint A/L2 (or also C/L2, D/L1). This fully corresponds to the above discussed case, with the only difference that FET 7 representing the coupling element is connected with its gate section 8 to control line $\bar{c}$. FET 7 is thus only conductive if the associated input A as well as control line $\bar{c}$ are in the logic "1" mode. According to the above agreement, this is so in functional mode F2 only. It should be pointed out that a coupling element effective only in one of the two functional modes F1 or F2 represents for the respective non-effective functional mode F2 or F1 a so-called "Don't care" position, as specified above.

The permanent personalization to the effect that a coupling element is to be active in both functional modes F1, F2 exists e.g. at crosspoint A/L1 (and also B/L1). This personalization mode simply corresponds to an FET applied with its complete gate at the respective input, e.g. FET 9 with its gate 10 at A. Depending on how this personalization mode is fixed in its structure, gate 10 can be formed either as a complete signal gate, or through the connection of two separately providable gate sections. Regarding the alternatives available for making such structural personalizations, reference is made to the known techniques generally known for ROMs and PLAs. According thereto, the respective personalization step can be executed e.g. during doping, masking, metallization etc. in the course of the semiconductor integrated circuit production.

An example of a "Don't care" position is crosspoint B/L2, where the respective input is ignored for both functional modes F1 and F2. There, an FET 11 without gate(s) is shown in FIG. 4. Since in the embodiment field effect transistors of the enhancement type ("normally-off" FETs) have been assumed, there is no conductive connection at any time at this crosspoint. It goes without saying that this personalization mode can also be designed alternatively in that one (or several) other condition(s) for a ready-for-use FET are not satisfied.

For the four crosspoints provided in OR array 2, coupling elements of the same type and following the same "wiring rules" for personalization are provided as in the above discussed AND array 1. The only difference is that instead of external inputs, the output lines L1, L2 of AND array 1 are to be considered input lines. The output lines of OR array 2 are formed by the column lines for (sum) terms X and Y.

For explaining the operation of the circuit of FIG. 4, functional mode F1 is assumed first. As above, for mode F1 assume c=1 and $\bar{c}$=0. Thus, all FETs having a gate section connected to the $\bar{c}$-line are non-conductive. For all FETs connected with their gate section to the c-line, however, one of the two (with 2 gates) conditions for enabling the respective FET is already satisfied. The second condition is formed in these cases by the logic state ("0" or "1") of the associated input. Where, as e.g. in FET 9, the complete gate 10 (or both gate sections) is connected to an input, the respective functional mode is no longer a condition; the conductive state of FET 9 thus only depends on input A. For the assumptions set forth in FIG. 4 with regard to the transistor types, signal polarities etc., and with c=1, i.e. positive potential on the c-line, FETs 9, 12 and 3 in the upper row of AND array 1 will be conductive when the associated inputs A, B or C adopt the logic "1" mode. In that case, the potential on the line marked L1 is decreased via the conductive FET(s) toward ground potential. In other words, L1 remains at the up-level ("1") only if all FETs in this row remain non-conductive, i.e. if A and B and C are in the "0" state. Input D at FET 13 is ignored since its gate half 14 is connected to the $\bar{c}$-line, and thus FET 13 in functional mode F1 remains continuously non-conductive. Consequently the following logic equation for L1 as a logic output line of AND array 1 applies:

$$L1 = \bar{A} \cdot \bar{B} \cdot \bar{C}$$

Similarly, for the lower row in AND array 1, output line L2 remains at the up-level ("1") only if FET 6 as the only FET connected to the c-line, remains non-conductive i.e. as long as its input D is in the "0" state. Thus, for L2 the formula is: $L2 = \bar{D}$.

L1 and L2 further represent input lines for the OR array marked 2. Of the four coupling elements provided there, FETs 15, 16 and 17 are ready to be conductive in functional mode F1 with c=1 and $\bar{c}$=0, when the associated input lines L1, L2 are at the up-level ("1"). With the above logic conditions applicable to L1 and L2 it follows that output line X adopts the up-level (+V), i.e. the "1" mode, when L1 or L2 is positive (OR function). There follows the logic equation:

$$X = L1 + L2 = \bar{A} \cdot \bar{B} \cdot \bar{C} + \bar{D}$$

If e.g. L1 is positive the X-line normally coupled to ground via R2 is raised via the conductive FET 15 toward the supply voltage +V. The same applies for a positive potential on the L2 line as a consequence of the then conductive FET 16.

In the F1 mode, output Y depends exclusively on the state of FET 17 and thus on L1 whether the associated Y-line can adopt the up-level ("1" mode). The further FET 18 is non-conductive in functional mode F1 due to its gate connections to the $\bar{c}$-line. There consequently applies:

$$Y = L1 = \bar{A} \cdot \bar{B} \cdot \bar{C} \text{ (see FIG. 1)}$$

For the logic functions of FIG. 2 during functional mode F2 there applies the above specification of the operating process. There, merely the reversal of the logic states on control lines c and $\bar{c}$ is to be observed. In that particular case, all FETs connected to the c-line are non-conductive due to c=0, independently of the signal input, e.g. FETs 3, 6, and 17. Again, L1 remains positive only when FETs 9, 12, and 13 (which from their wiring can become conductive) remain non-conductive, i.e. if their inputs A, B, and D remain in the "0" state, i.e. $L1 = \bar{A} \cdot \bar{B} \cdot \bar{D}$.

Correspondingly, it is of importance for L2=1 that FETs 7 and 19 remain non-conductive, e.g. that their inputs A and C remain in the "0" state, i.e. $L2 = \bar{A} \cdot \bar{C}$.

The other FETs 11 and 6 cannot become conductive since either their gates are not connected, or since one gate is contacted with the c-control line (c=0). The OR function of L1 and L2 in OR array 2 is carried out accordingly, as described above from F1. Instead of FET 18, as above, FET 17 is non-conductive now so that for output Y the L1-state is ignored. The total of all effected logic functions is thus the one shown in FIG. 2.

It is noted that in the above described manner, and without special components as e.g. MNOS-FETs etc. PLAs with a permanent multiple personalization can be provided which offer an extraordinarily quick switching between the respective personalized functions through the simple switching of control line potentials (c, c̄). Furthermore, it is apparent that this multiple personalization is obtainable without requiring an accordingly increased amount of coupling elements or semiconductor surface.

Figure 6:
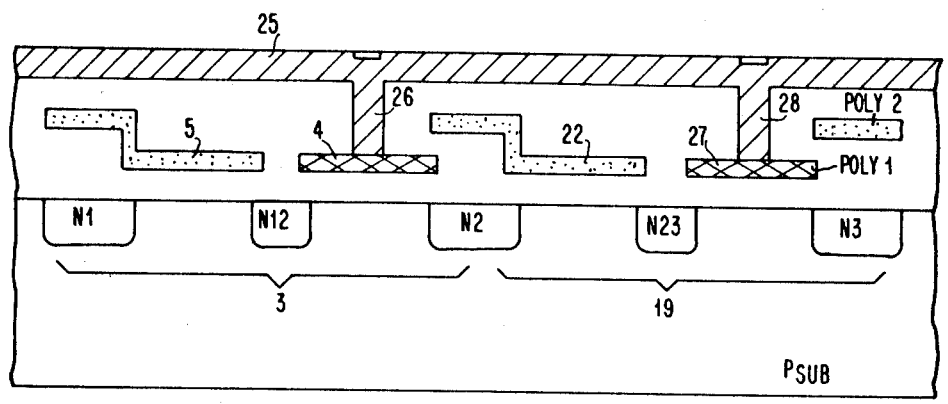
FIG. 6 is a cross-section along the sectional line 6—6 on FIG. 5 explaining the schematic vertical structure of the preferred integrated embodiment.
Figure 5:
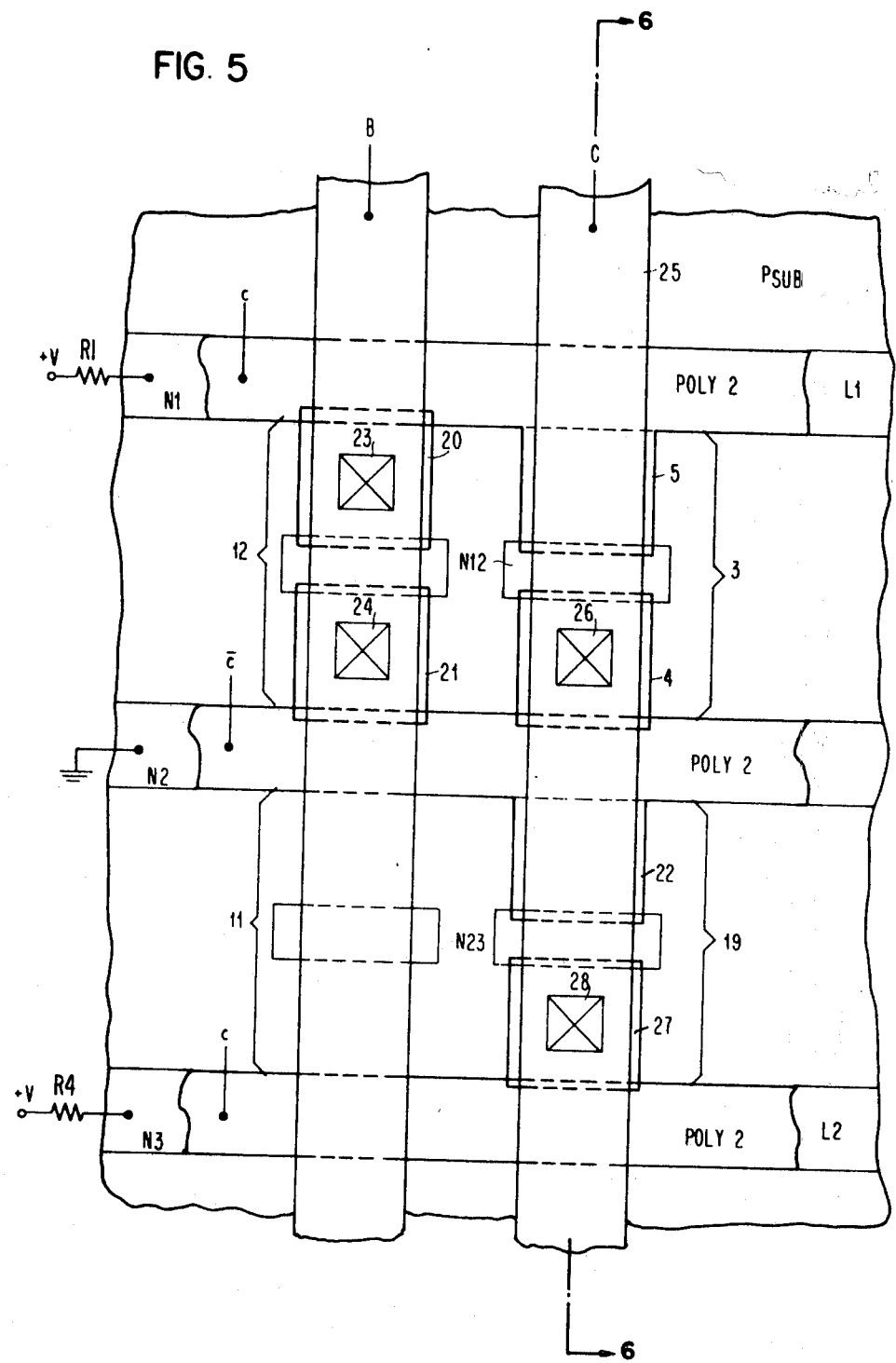
FIG. 5 is a schematic plan view of a preferred integrated embodiment of part of the circuit shown in FIG. 4.

In the following, an embodiment of the invention will be described for a particularly surface-saving integrated structure of such coupling elements, using a conventional so-called double polysilicon manufacturing process. FIGS. 5 and 6 show in a plan view and in a cross-section a section of the circuit diagram of FIG. 4 the four crosspoints with coupling elements (FET) 12, 3, 11 and 19, as well as inputs B and C. For an easier correlation, substantially the same reference numbers as in FIG. 4 have been used. FIGS. 5 and 6 are merely schematic representations and do not represent layouts true to scale.

A semiconductor substrate marked $P_{SUB}$, e.g. of silicon, contains in a manner usual for the MOSFET- technology the source and drain zones as doping stripes N1, N2 and N3. For doping stripes N1 and N3 serving as drain zones the connection to the supply voltage +V is schematically illustrated via load resistors R1 and R4, respectively. The N1 and N3 doping stripes form on the other side the (product term) lines L1 and L2. N2 is the common source region for the coupling elements of adjacent lines, and is e.g. coupled to ground. Since the embodiment provides two gate sections for each coupling element, channel-supporting doping regions, e.g. N12 and N23 are provided between those gate sections.

On the substrate surface, with insulating layers in predetermined patterns being provided in a known manner, two layers of (conductive) polycrystalline silicon, in the following called polysilicon and in the drawings marked POLY 1 and POLY 2, as well as a metallization level, e.g. of aluminum are formed. Depending on the cell mode for the respective coupling element only one of the two gate sections, e.g. 4 for FET 3, or a complete gate as e.g. in FET 12 with 2 connected gate halves 20, 21 is made with the first layer of polysilicon, POLY 1. With the second layer of polysilicon, POLY 2, the c and c̄ control lines are made as well as the gate half (or halves), e.g. 5 and 22 to be connected thereto. Transversally to the doping stripes for N1, N2, N3 and the superimposed control line c, c̄ (POLY 2) the input lines are arranged as metallization stripes. This is illustrated in FIGS. 5 and 6 for inputs B and C. There, input B is connected via the contact points marked 23, 24 in the FET 12 region to both gate sections 20, 21. For input C, FIG. 5 and better still the cross-section of FIG. 6 show that the associated line 25 is connected to gate section 4 of FET 3 via contact 26 and to gate section 27 of FET 19 via contact 28. At crosspoint B/L2, one of the above mentioned so-called "Don't care" positions is provided. There the FET position marked 11 is not completed due to the non-existence of the gate and associated thin oxide sections. At this crosspoint there can be made no connection between N3 and N2 in any of the two assumed functional modes F1, F2.

To the extent a PLA structure has been selected as an exemplary embodiment, it should be pointed out that the invention can be used with similar advantages in the field of conventional read-only memories (ROM) which, as mentioned above, can be considered components of PLAs. Furthermore, the invention is not restricted to permanent storages of two-fold personalization. It is evident that, for instance, a three-fold personalization can be achieved by providing three gate sections for the FETs used as coupling elements. Further, the invention is not restricted to the FET types of the embodiments; if the respective supply voltage and signal polarity requirements are observed, it is e.g. possible to use P-channel FETs. From a more general point of view, the idea of the invention is not necessarily tied to the FET technology. It can also be realized in other modern technologies, e.g. in bipolar, Josephson, GaAs-technology, etc. The same applies to the agreement of a differently selected correlation of the potentials relative to the logic modes, as well as regarding the materials of the embodiments, e.g. silicon, polysilicon and aluminum, for which there exists a multitude of alternatives in the field of known semi-conductor technology.

While the invention has been particularly shown and described with reference to the prefered embodiments thereof, it will be understood by those skilled in the art that various changes in form and detail may be made therein without departing from the spirit and scope of the invention.

What is claimed is:

1. A permanent storage array having at least two independently selectable logic functions comprising:
   a matrix arrangement including a plurality of input and output lines forming crosspoints;
   control lines for the selective activation of one of the at least two independently selectable functions;
   coupling elements provided at said crosspoints which depending on their individual personalization selectively provide an electrically conductive path at a crosspoint, said coupling elements being formed of transistor structures with two gated electrodes and at least two gating electrodes, the associated circuit path between said two gated electrodes becoming conductive when a turn-on potential is applied to the at least two gating electrodes; and
   connecting means connecting one of the gating electrodes of said coupling elements to the control line determinative of one of said selectable functions and the at least one remaining gating electrode of said coupling element to a corresponding input line for establishing connection in only one of said at least two independently selectable functions, said connecting means connecting all of the at least two gating electrodes of said coupling elements to the corresponding input line for establishing connections in all of said at least two independently selectable functions.

2. A permanent storage array for quickly executing at least two independently selectable logic functions comprising:
   a matrix arrangement including a plurality of input and output lines forming crosspoints;
   control lines for the selective activation of one of the at least two independently selectable functions;

coupling elements provided at said crosspoints which depending on their individual personalization selectively provide an electrically conductive path at a crosspoint, said coupling elements being formed of field effect transistors with at least two adjacent gate sections, the associated source-drain circuit path becoming conductive under the condition that a turn-on switching potential is applied to the at least two gate sections; and connecting means electrically coupling one of the at least two gate sections of said transistors to the control line determinative of one of said selectable logic functions and the at least one remaining gate section to a corresponding input line for establishing a connection in only one of said at least two independently selectable functions, said connecting means electrically coupling all of said at least two sections of the transistor to the corresponding input line for establishing a connection in all of said at least two selectable functions.

3. The storage array of claim 1 or 2 wherein the coupling elements in adjacent rows or columns have associated common row or column control lines or supply voltage lines.

4. The storage array of claims 1 or 3 wherein several arrays are assembled to form programmable logic array structures.

5. The storage array of claim 2 wherein said coupling elements comprise: integrated field effect transistor structures of the enhancement type which in the channel region between source and drain, beneath the boundaries between adjacent gate sections have doping areas supporting the channel formation.

6. The storage array of claim 2 wherein said gate sections of the coupling elements consist of polycrystalline silicon.

7. The storage array of claim 2 wherein the gate sections coupled to the input lines are a first polysilicon layer, and the control lines as well as the gate sections coupled thereto are a second polysilicon layer.

8. The storage array of claim 7 wherein the input lines are metal lines connected by contacts with the associated gate sections of polysilicon.

* * * * *